US011171008B2

(12) United States Patent
Lee et al.

(10) Patent No.: US 11,171,008 B2
(45) Date of Patent: Nov. 9, 2021

(54) ABATEMENT AND STRIP PROCESS CHAMBER IN A DUAL LOAD LOCK CONFIGURATION

(71) Applicant: Applied Materials, Inc., Santa Clara, CA (US)

(72) Inventors: Jared Ahmad Lee, Santa Clara, CA (US); Martin Jeffrey Salinas, San Jose, CA (US); Paul B. Reuter, Austin, TX (US); Imad Yousif, San Jose, CA (US); Aniruddha Pal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/717,963

(22) Filed: Dec. 17, 2019

(65) Prior Publication Data

US 2020/0126802 A1    Apr. 23, 2020

Related U.S. Application Data

(60) Continuation of application No. 16/584,732, filed on Sep. 26, 2019, which is a division of application No. (Continued)

(51) Int. Cl.
  *H01L 21/3065*    (2006.01)
  *H01L 21/67*    (2006.01)
  (Continued)

(52) U.S. Cl.
  CPC .... *H01L 21/3065* (2013.01); *H01J 37/32844* (2013.01); *H01L 21/02071* (2013.01);
  (Continued)

(58) Field of Classification Search
  CPC ........... H01L 21/68742; H01L 21/3065; H01L 21/027071; H01L 21/32137;
  (Continued)

(56) References Cited

U.S. PATENT DOCUMENTS

| 4,139,051 A | 2/1979 | Jones et al. |
| 4,816,638 A | 3/1989 | Ukai et al. |

(Continued)

FOREIGN PATENT DOCUMENTS

| CN | 1943003 A | 4/2007 |
| JP | H10-189541 A | 7/1998 |

(Continued)

OTHER PUBLICATIONS

International Search Report and Written Opinion dated May 10, 2013, PCT Application: PCT/US2013/022228.

(Continued)

*Primary Examiner* — Charlee J. C. Bennett
(74) *Attorney, Agent, or Firm* — Patterson + Sheridan, LLP

(57) ABSTRACT

Embodiments of the present invention provide a dual load lock chamber capable of processing a substrate. In one embodiment, the dual load lock chamber includes a chamber body defining a first chamber volume and a second chamber volume isolated from one another. Each of the lower and second chamber volumes is selectively connectable to two processing environments through two openings configured for substrate transferring. The dual load lock chamber also includes a heated substrate support assembly disposed in the second chamber volume. The heated substrate support assembly is configured to support and heat a substrate thereon. The dual load lock chamber also includes a remote plasma source connected to the second chamber volume for supplying a plasma to the second chamber volume.

20 Claims, 11 Drawing Sheets

Related U.S. Application Data

14/002,087, filed as application No. PCT/US2012/027135 on Feb. 29, 2012, now Pat. No. 10,453,694.

(60) Provisional application No. 61/448,027, filed on Mar. 1, 2011.

(51) Int. Cl.

| | | |
|---|---|---|
| *H01L 21/687* | (2006.01) | |
| *H01L 21/3213* | (2006.01) | |
| *H01L 21/02* | (2006.01) | |
| *H01J 37/32* | (2006.01) | |

(52) U.S. Cl.
CPC .. *H01L 21/32137* (2013.01); *H01L 21/67069* (2013.01); *H01L 21/67201* (2013.01); *H01L 21/68785* (2013.01); *Y02C 20/30* (2013.01); *Y02P 70/50* (2015.11)

(58) Field of Classification Search
CPC ......... H01L 21/67069; H01L 21/67201; H01L 21/68785
USPC .................................. 118/715–733
See application file for complete search history.

(56) References Cited

U.S. PATENT DOCUMENTS

| | | | |
|---|---|---|---|
| 4,951,601 A * | 8/1990 | Maydan | ............ H01L 21/67167 |
| | | | 118/715 |
| 4,952,299 A | 8/1990 | Chrisos et al. | |
| 5,071,714 A | 12/1991 | Rodbell et al. | |
| 5,188,979 A | 2/1993 | Filipiak | |
| 5,198,634 A | 3/1993 | Mattson et al. | |
| 5,217,501 A | 6/1993 | Fuse et al. | |
| 5,332,443 A | 7/1994 | Chew et al. | |
| 5,337,207 A | 8/1994 | Jones et al. | |
| 5,356,833 A | 10/1994 | Maniar et al. | |
| 5,376,213 A | 12/1994 | Ueda et al. | |
| 5,522,937 A | 6/1996 | Chew et al. | |
| 5,545,289 A | 8/1996 | Chen et al. | |
| 5,571,367 A | 11/1996 | Nakajima et al. | |
| 5,633,073 A | 5/1997 | Cheung et al. | |
| 5,641,702 A | 6/1997 | Imai et al. | |
| 5,643,366 A | 7/1997 | Somekh et al. | |
| 5,753,133 A | 5/1998 | Wong et al. | |
| 5,753,891 A | 5/1998 | Iwata et al. | |
| 5,840,200 A | 11/1998 | Nakagawa et al. | |
| 5,895,549 A | 4/1999 | Goto et al. | |
| 5,904,799 A | 5/1999 | Donohoe | |
| 5,948,704 A | 9/1999 | Benjamin et al. | |
| 5,976,310 A | 11/1999 | Levy | |
| 6,000,227 A | 12/1999 | Kroeker | |
| 6,035,101 A | 3/2000 | Sajoto et al. | |
| 6,114,216 A | 9/2000 | Yieh et al. | |
| 6,136,211 A | 10/2000 | Qian et al. | |
| 6,143,082 A | 11/2000 | McInerney et al. | |
| 6,148,072 A | 11/2000 | Huang | |
| 6,204,141 B1 | 3/2001 | Lou | |
| 6,228,563 B1 | 5/2001 | Starov et al. | |
| 6,228,739 B1 | 5/2001 | Ha et al. | |
| 6,257,168 B1 | 7/2001 | Ni et al. | |
| 6,264,706 B1 | 7/2001 | Hirano | |
| 6,267,074 B1 | 7/2001 | Okumura | |
| 6,270,568 B1 | 8/2001 | Droopad et al. | |
| 6,270,582 B1 | 8/2001 | Rivkin et al. | |
| 6,297,095 B1 | 10/2001 | Muralidhar et al. | |
| 6,299,691 B1 | 10/2001 | Oda et al. | |
| 6,300,202 B1 | 10/2001 | Hobbs et al. | |
| 6,300,212 B1 | 10/2001 | Inoue et al. | |
| 6,319,730 B1 | 11/2001 | Ramdani et al. | |
| 6,326,261 B1 | 12/2001 | Tsang et al. | |
| 6,335,207 B1 | 1/2002 | Joo et al. | |
| 6,348,386 B1 | 2/2002 | Gilmer | |
| 6,358,859 B1 | 3/2002 | Lo et al. | |
| 6,375,746 B1 | 4/2002 | Stevens et al. | |
| 6,399,507 B1 | 6/2002 | Nallan et al. | |
| 6,414,280 B1 | 7/2002 | Nishitani et al. | |
| 6,431,807 B1 | 8/2002 | Stevens et al. | |
| 6,440,864 B1 | 8/2002 | Kropewnicki et al. | |
| 6,458,253 B2 | 10/2002 | Ando et al. | |
| 6,466,426 B1 | 10/2002 | Mok et al. | |
| 6,479,801 B1 | 11/2002 | Shigeoka et al. | |
| 6,485,988 B2 | 11/2002 | Ma et al. | |
| 6,514,378 B1 | 2/2003 | Ni et al. | |
| 6,528,427 B2 | 3/2003 | Chebi et al. | |
| 6,592,771 B1 | 7/2003 | Yamanaka et al. | |
| 6,616,767 B2 | 9/2003 | Zhao et al. | |
| 6,635,185 B2 | 10/2003 | Demmin et al. | |
| 6,688,375 B1 | 2/2004 | Turner et al. | |
| 6,890,861 B1 | 5/2005 | Bosch | |
| 6,899,507 B2 | 5/2005 | Yamagishi et al. | |
| 6,935,466 B2 | 8/2005 | Lubomirsky et al. | |
| 7,045,014 B2 | 5/2006 | Mahon et al. | |
| 7,207,766 B2 | 4/2007 | Kurita et al. | |
| 7,318,879 B2 | 1/2008 | Kwon et al. | |
| 7,396,480 B2 | 7/2008 | Kao et al. | |
| 7,497,414 B2 | 3/2009 | Lee et al. | |
| 7,506,654 B2 | 3/2009 | Chandran et al. | |
| 7,695,232 B2 | 4/2010 | Moore et al. | |
| 7,732,728 B2 | 6/2010 | Dhindsa et al. | |
| 7,846,845 B2 | 12/2010 | Bahng et al. | |
| 8,033,769 B2 | 10/2011 | Gage et al. | |
| 8,060,252 B2 | 11/2011 | Systems | |
| 8,272,825 B2 | 9/2012 | Hofmeister et al. | |
| 8,662,812 B2 | 3/2014 | Hofmeister et al. | |
| 8,845,816 B2 | 9/2014 | Diaz et al. | |
| 8,992,689 B2 | 3/2015 | Diaz et al. | |
| 9,464,732 B2 * | 10/2016 | Reuter | ................ H01L 21/6719 |
| 10,090,181 B2 | 10/2018 | Lee et al. | |
| 10,204,805 B2 | 2/2019 | Yousif et al. | |
| 2001/0055852 A1 | 12/2001 | Moise et al. | |
| 2002/0011207 A1 | 1/2002 | Uzawa et al. | |
| 2002/0025375 A1 | 2/2002 | Takamori et al. | |
| 2002/0046810 A1 | 4/2002 | Tanaka et al. | |
| 2002/0074312 A1 | 6/2002 | Ou-Yang et al. | |
| 2002/0104751 A1 | 8/2002 | Drewery et al. | |
| 2002/0144786 A1 | 10/2002 | Chiang et al. | |
| 2003/0003696 A1 | 1/2003 | Gelatos et al. | |
| 2003/0045131 A1 | 3/2003 | Verbeke et al. | |
| 2003/0057179 A1 | 3/2003 | Luo et al. | |
| 2003/0092278 A1 | 5/2003 | Fink | |
| 2003/0153177 A1 | 8/2003 | Tepman et al. | |
| 2003/0170986 A1 | 9/2003 | Nallan et al. | |
| 2004/0002223 A1 | 1/2004 | Nallan et al. | |
| 2004/0007176 A1 | 1/2004 | Janakiraman et al. | |
| 2004/0007561 A1 | 1/2004 | Nallan et al. | |
| 2004/0043544 A1 | 3/2004 | Asai et al. | |
| 2004/0177810 A1 | 9/2004 | Ohta | |
| 2004/0203251 A1 | 10/2004 | Kawaguchi et al. | |
| 2004/0226514 A1 | 11/2004 | Mahon et al. | |
| 2005/0045101 A1 * | 3/2005 | Ishihara | ................ C23C 14/564 |
| | | | 118/719 |
| 2005/0045616 A1 * | 3/2005 | Ishihara | ............ H01L 21/67201 |
| | | | 219/390 |
| 2005/0183827 A1 * | 8/2005 | White | ................. H01J 37/3244 |
| | | | 156/345.34 |
| 2005/0189074 A1 | 9/2005 | Kasai et al. | |
| 2005/0208714 A1 | 9/2005 | Yamazaki et al. | |
| 2005/0224181 A1 | 10/2005 | Merry et al. | |
| 2006/0105575 A1 * | 5/2006 | Bailey, III et al. | .......................... |
| | | | H01L 21/67051 |
| | | | 438/706 |
| 2006/0231027 A1 | 10/2006 | Iwabuchi | |
| 2006/0234178 A1 | 10/2006 | Hayashi et al. | |
| 2006/0245852 A1 * | 11/2006 | Iwabuchi | .......... H01L 21/67201 |
| | | | 414/217 |
| 2007/0062558 A1 | 3/2007 | Suzuki et al. | |
| 2007/0102286 A1 | 5/2007 | Scheible et al. | |
| 2007/0140814 A1 | 6/2007 | Kurita et al. | |
| 2007/0151514 A1 | 7/2007 | Chen et al. | |
| 2007/0166133 A1 | 7/2007 | Lee et al. | |
| 2007/0240631 A1 | 10/2007 | Materials | |
| 2008/0019666 A1 | 1/2008 | Kato et al. | |

(56) References Cited

U.S. PATENT DOCUMENTS

| | | |
|---|---|---|
| 2008/0056857 A1 | 3/2008 | Hiroki |
| 2008/0099040 A1 | 5/2008 | Bahng et al. |
| 2008/0102646 A1* | 5/2008 | Kawaguchi ....... H01L 21/02057 438/725 |
| 2008/0105650 A1 | 5/2008 | Sugai et al. |
| 2009/0014324 A1 | 1/2009 | Kawaguchi et al. |
| 2009/0028761 A1 | 1/2009 | Devine et al. |
| 2009/0031955 A1 | 2/2009 | Lu et al. |
| 2009/0067823 A1 | 3/2009 | Kusuda |
| 2009/0127102 A1 | 5/2009 | Lee et al. |
| 2009/0142167 A1* | 6/2009 | Gage ................. H01L 21/67742 414/221 |
| 2009/0179365 A1 | 7/2009 | Lerner et al. |
| 2009/0191030 A1 | 7/2009 | Bluck et al. |
| 2009/0200269 A1 | 8/2009 | Kadkhodayan et al. |
| 2009/0206056 A1 | 8/2009 | Xu et al. |
| 2009/0233449 A1 | 9/2009 | Lebouitz et al. |
| 2010/0059478 A1* | 3/2010 | Lee .................... H01L 21/68735 216/71 |
| 2010/0133255 A1 | 6/2010 | Bahng et al. |
| 2010/0147396 A1 | 6/2010 | Yamagishi et al. |
| 2010/0190343 A1 | 7/2010 | Aggarwal |
| 2010/0288369 A1 | 11/2010 | Chang et al. |
| 2011/0024399 A1 | 2/2011 | Kim et al. |
| 2011/0031214 A1 | 2/2011 | Kim et al. |
| 2011/0052833 A1 | 3/2011 | Manawa et al. |
| 2011/0236600 A1 | 9/2011 | Fox et al. |
| 2011/0287632 A1* | 11/2011 | Brown ................. H01L 21/3065 438/716 |
| 2011/0304078 A1 | 12/2011 | Lee et al. |
| 2012/0222813 A1 | 9/2012 | Pal et al. |
| 2012/0264051 A1 | 10/2012 | Angelov et al. |
| 2012/0285621 A1* | 11/2012 | Tan .................... H01J 37/32724 156/345.31 |
| 2012/0329000 A1 | 12/2012 | Hirakawa |
| 2013/0224953 A1 | 8/2013 | Salinas et al. |
| 2013/0284287 A1* | 10/2013 | Reuter ............... H01L 21/67017 137/356 |
| 2013/0334199 A1* | 12/2013 | Yousif .................. H01L 21/263 219/446.1 |
| 2013/0337655 A1* | 12/2013 | Lee .................... H01L 21/67201 438/715 |
| 2013/0340938 A1 | 12/2013 | Tappan et al. |
| 2014/0087561 A1* | 3/2014 | Lee .................... C23C 16/45517 438/689 |
| 2018/0247850 A1 | 8/2018 | Lee et al. |
| 2020/0027742 A1* | 1/2020 | Lee .................... H01L 21/02071 |

FOREIGN PATENT DOCUMENTS

| | | |
|---|---|---|
| JP | 2004241420 A * | 8/2004 |
| JP | 2004241420 A | 8/2004 |
| JP | 2004-319540 A | 11/2004 |
| JP | 2005-72525 | 3/2005 |
| JP | 2008251991 | 10/2005 |
| JP | 20050224181 | 10/2005 |
| JP | 2009-152635 A | 7/2009 |
| KR | 10-2009-0056919 | 6/2009 |
| KR | 20110009541 A | 1/2011 |
| KR | 20110092825 A | 8/2011 |
| WO | 2012118897 A2 | 9/2012 |

OTHER PUBLICATIONS

International Search Report and Written Opinion dated Sep. 12, 2012 for PCT/US2012/027135.
Japanese Office Action (with attached English translation) for Application No. 2013-556826; dated Jan. 19, 2016; 6 total pages.
Japanese Office Action (with attached English translation) for Application No. 2013-556826; dated Jan. 8, 2016; 6 total pages.
Japanese Office Action dated Oct. 25, 2016, filed in Japanese counterpart Application No. 2013-556826, 6 pages (with translation).
Korean Office Action dated Apr. 5, 2018 for Application No. 10-2013-7025383.
Office Action and Search Report for Chinese Application No. 201280010528.6 dated Jun. 30, 2015.
Office Action and Search Report for Taiwan No. 101106559 dated Jan. 28, 2016, 8 pages (with translation).
Office Action for U.S. Appl. No. 13/746,831 dated Feb. 26, 2016.
Office Action for U.S. Appl. No. 14/002,087 dated Dec. 2, 2016.
Final Office Action for U.S. Appl. No. 14/002,087 dated Jun. 5, 2017.
Office Action for U.S. Appl. No. 14/002,087 dated Dec. 20, 2017.
Final Office Action for U.S. Appl. No. 14/002,087 dated May 17, 2018.
Office Action for U.S. Appl. No. 14/002,087 dated Dec. 13, 2018.

* cited by examiner

… (1)

ABATEMENT AND STRIP PROCESS CHAMBER IN A DUAL LOAD LOCK CONFIGURATION

CROSS-REFERENCE TO RELATED APPLICATIONS

This application is a continuation of co-pending U.S. patent application Ser. No. 16/584,732, filed Sep. 26, 2019, which is a divisional of U.S. patent application Ser. No. 14/002,087, filed Feb. 29, 2012, now issued as U.S. Pat. No. 10,453,694, which is a national stage application under 35 U.S.C. 371 of International Application No. PCTUS1227135, filed Feb. 29, 2012, which claims benefit of U.S. Provisional Application No. 61/448,027, filed Mar. 1, 2011. The above referenced applications are all incorporated by reference herein.

BACKGROUND

Field

Embodiment of the present invention generally relates to a method and apparatus for fabricating devices on a semiconductor substrate. More particularly, embodiments of the present invention relate to load lock chamber including two chamber volumes and at least one chamber volume is configured for processing a substrate.

Description of the Related Art

Embodiment of the present invention generally relates to a method and apparatus for fabricating devices on a semiconductor substrate. More particularly, embodiments of the present invention relate to load lock chamber including two load locks and capable for processing a substrate.

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine ($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure.

Several processes have been developed to remove the halogen-containing residues on the etched substrates. For example, the etched substrate may be transferred into a remote plasma reactor to expose the etched substrate to a gas mixture that converts the halogen-containing residues to non-corrosive volatile compounds that may be out-gassed and pumped out of the reactor. However, such process requires a dedicated process chamber along with an additional step, causing increased tool expense, reduced manufacturing productivity and throughput, resulting in high manufacturing cost.

Therefore, there is a need for an improved method and apparatus for removing halogen-containing residues from a substrate.

SUMMARY

Embodiments of the present invention generally provide apparatus and methods for processing a substrate. Particularly, embodiments of the present inventions provide a dual load lock chamber capable of processing a substrate, for example by exposing the substrate positioned therein to a reactive species.

One embodiment of the present invention provides a load lock chamber. The load lock chamber includes a chamber body defining a first chamber volume and a second chamber volume isolated from one another. The first chamber volume is selectively connectable to two processing environments through two openings configured for substrate transferring. The second chamber volume is selectively connected to at least one of the two processing environments. The load lock chamber further includes a heated substrate support assembly disposed in the second chamber volume and a remote plasma source connected to the second chamber volume for supplying a plasma to the second chamber volume. The heated substrate support assembly is configured to support and heat a substrate thereon.

One embodiment of the present invention provides a dual load lock chamber. The dual load lock chamber includes a chamber body defining a first chamber volume and a second chamber volume isolated from one another. Each of the first and second chamber volumes is selectively connectable to two separate adjacent environments through two openings configured for substrate transferring. The dual load lock chamber also includes a heated substrate support assembly disposed in the second chamber volume. The heated substrate support assembly is configured to support and heat a substrate thereon. The dual load lock chamber also includes a remote plasma source connected to the second chamber volume for supplying reactive species to the second chamber volume.

Another embodiment of the present invention provides a dual load lock chamber. The dual load lock chamber includes a chamber body defining a second chamber volume and a lower lock load volume isolated from one another, a substrate support assembly configured to support a substrate disposed in the first chamber volume, and a heated substrate support assembly configured to support and heat a substrate disposed in the second chamber volume. Each of the first and second chamber volumes is selectively connectable to two separate adjacent environments through two openings configured for substrate transferring. The dual load lock chamber also includes a shower head assembly disposed over the heated substrate support assembly, wherein the showerhead assembly is configured to distribute one or more processing gas to the second chamber volume.

Yet another embodiment of the present invention provides a method for removing halogen-containing residues from a substrate. The method includes transferring a substrate to a substrate processing system through an incoming load lock of a double load lock chamber coupled to the substrate processing system, and etching the substrate in the substrate processing system with chemistry comprising halogen. The method also includes removing halogen-containing residues from the etched substrate in an outgoing load lock of the double load lock chamber, wherein the outgoing load lock is isolated from the incoming load lock in a single chamber body. Removing halogen-containing residues includes heating the etched substrate on a heated substrate support assembly of the outgoing load lock, and flowing a processing gas to the outgoing load lock.

The method described above, wherein removing halogen-containing residues includes creating a symmetrical processing environment using a hoop liner surrounding the heated substrate support assembly.

The method described above, wherein flowing the processing gas may include generating a plasma of the processing gas in a remote plasma source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention provide apparatus and methods for fabricating devices on a semiconductor substrate. More particularly, embodiments of the present invention relate to a dual load lock chamber including two isolated chamber volumes, wherein at least one chamber volume is configured for processing a substrate, for example, by exposing the substrate to reactive species.

One embodiment of the present invention provides a load lock chamber having at least two isolated chamber volumes formed in a body assembly. The two isolated chamber volumes may be vertically stacked or disposed side-by-side. The two chamber volumes are independently operable to increase throughput. In one embodiment, a first chamber volume is configured to expose a substrate disposed therein to reactive species, for example removing halogen residual from the substrate or removing photoresist from the substrate. The second chamber volume is utilized only to exchange between adjoining environments, such as an environment of a factory interface and transfer chamber. One embodiment of the present invention provides a load lock chamber including a thin heated substrate support for heating the substrate therein and a showerhead disposed over the thin heated substrate support for uniformly supplying one or more processing gases to the load lock chamber. In one embodiment, the showerhead is connected to a remote plasma source to supply reactive species to the load lock chamber. The load lock chamber of the present invention may also include a hoop liner to create a symmetrical processing environment within the chamber volume utilized to process the substrate. In one embodiment of the present invention, the hoop liner may be coupled to one or more lift fingers configured to exchange substrates with substrate transfer robots disposed outside of the load lock chamber.

Figure 1:
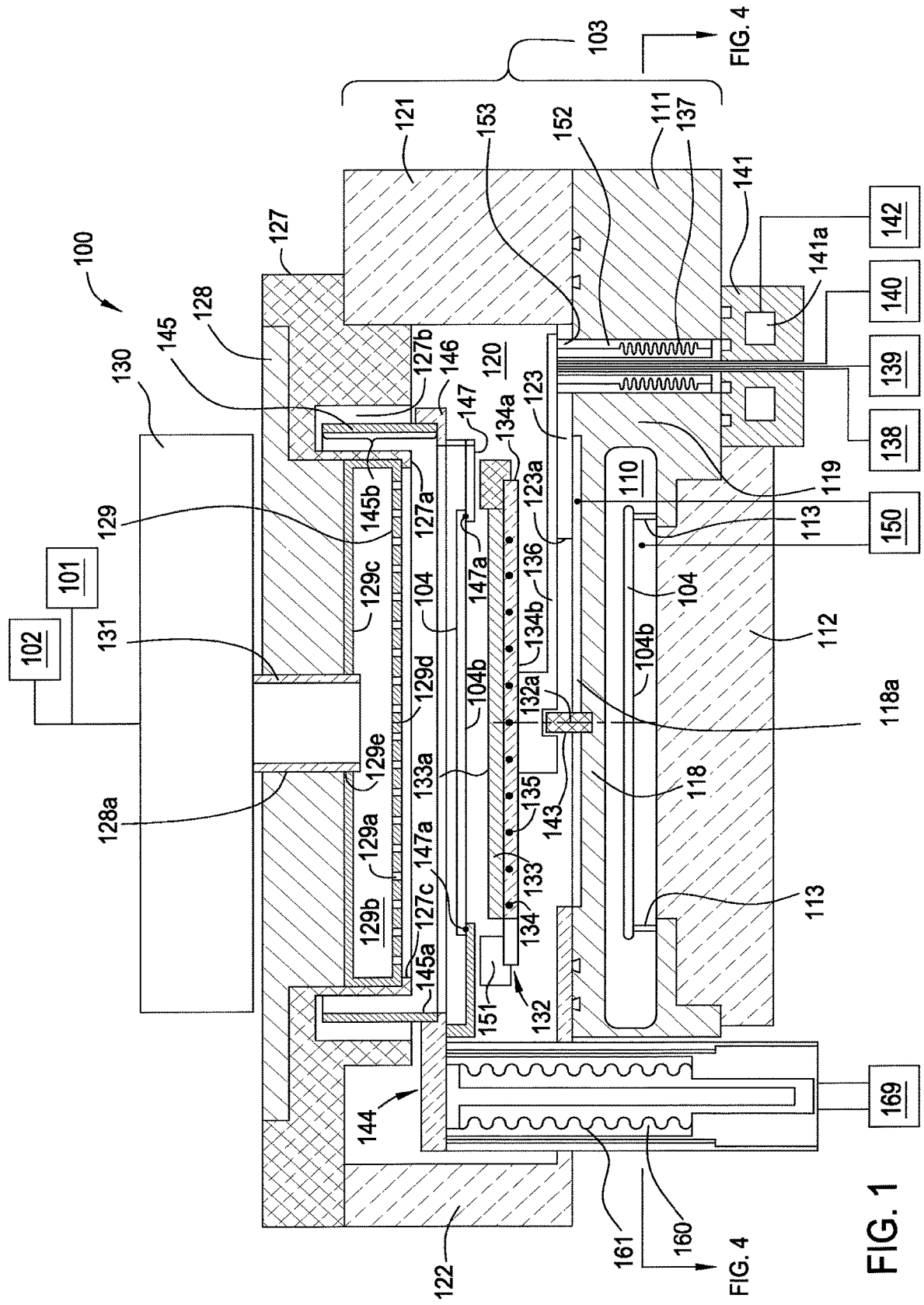
FIG. 1 is a schematic sectional view of a dual load lock chamber according to one embodiment of the present invention.

FIG. 1 is a schematic sectional view of a dual load lock chamber 100 according to one embodiment of the present invention. The dual load lock chamber 100 includes a first chamber volume 110 for transferring a substrate 104, and a second chamber volume 120 for transferring and processing a substrate 104. The second chamber volume 120 and the first chamber volume 110 are vertically stacked together and are isolated from one another.

The dual load lock chamber 100 includes a chamber body assembly 103. In one embodiment, the chamber body assembly 103 includes a first chamber body 111 and a second chamber body 121 coupled together to define a unitary structure housing the first and second chamber volumes 120, 110. In one embodiment, the first chamber body 111 and the second chamber body 121 are vertically stacked. Although the first chamber body 111 is shown stack below the second chamber body 121, it is contemplated the first chamber body 111 may be stack above the second chamber body 121 or positioned horizontally side-by-side.

The second chamber volume 120 of the dual load lock chamber 100 has a showerhead 129, a heated substrate support assembly 132, and a lift hoop assembly 144. The showerhead 129 is disposed over the heated substrate support assembly 132. The lift hoop assembly 144 is configured to confine a processing environment within the second chamber volume 120, as well as being operable to load and unload substrates from the heated substrate support assembly 132 and substrate transfer robots (not shown).

The second chamber volume 120 is defined by sidewalls 122 of the second chamber body 121, a lid liner 127 disposed over the sidewalls 122, a bottom wall 123 of the second chamber body 121, and a top wall 118 of the first chamber body 111. The lid liner 127 has an inner lip 127a forming a central opening 127c. The inner lip 127a holds a showerhead 129 and a source adapter plate 128. In one embodiment, the lid liner 127 is removably disposed over the second chamber body 121 to allow access to chamber components.

The showerhead 129 includes a face plate 129d having a plurality of through holes 129a formed therethrough and a back plate 129c having a central opening 129e. The face plate 129d and the back plate 129c enclose an inner volume 129b. The inner volume 129b serves as a plenum for enhancing the radial uniformity of gas provided into the second chamber volume 120 through the through holes 129a formed through the face plate 129d.

The source adapter plate 128 is disposed above the back plate 129c of the showerhead 129. The source adapter plate 128 has a central opening 128a matches with the central opening 129e of the showerhead 129. A remote plasma source 130 is in fluid communication with the inner volume 129b of the showerhead 129 through a quartz insert 131 disposed in the central openings 129e and 128a. The disassociated reactive species from the remote plasma source 130 enters the second chamber volume 120 through the quartz insert 131 to the inner volume 129b of the showerhead 129, then through the through holes 129a of the showerhead 129 to the second chamber volume 120.

In one embodiment, the showerhead 129 is fabricated formed from quartz such that surfaces of the inner volume 129b exposed to the reactive species within the plenum is lined by quartz. The quartz insert 131 and the showerhead 129 shield metal chamber components from being exposed to the reactive species provided from the remote plasma source 130, thus substantially reducing species recombination, attack of metal chamber components and particle generation.

The remote plasma source 130 is generally connected to one or more gas panels for supplying one or more processing gas to the first chamber volume 110 through the remote plasma source 130. In one embodiment, the remote plasma source 130 is connected to a first gas panel 101 configured for providing processing gases for an abatement process to remove residual material after etching and a second gas panel 102 configured for providing processing gases for an ashing process to remove photoresist.

The heated substrate support assembly 132 is configured to fit in the second chamber volume 120 of the dual load lock chamber 100. The heated substrate support assembly 132 is installed to be substantially thermally insulated from the chamber body assembly 103. In one embodiment, the heated substrate support assembly 132 is configured to heat the substrate 104 up to 300° C. while the chamber body assembly 103 remains cool.

In one embodiment, the heated substrate support assembly 132 includes an upper heater plate 133, a lower heater plate 134 attached to the upper heater plate 133, and a heater 135 disposed between the upper heater plate 133 and the lower heater plate 134. In one embodiment, the heater 135 may be disposed in channels formed on an upper surface of the lower heater plate 134. The heater 135 may be a resistive heater or conduits arranged to flow a heat transfer fluid. The upper heater plate 133 and the lower heater plate 134 may be joined together by bolts, welding or brazing. In one embodiment, the upper heater plate 133 and the lower heater plate 134 may be formed from metal, such as aluminum.

The upper heater plate 133 is configured to support the backside 104b of the substrate 104. In one embodiment, the lower heater plate 134 has an outer diameter larger than the outer diameter of the upper heater plate 133. A focus ring 151 may be disposed on an outer edge 134a of the lower heater plate 134 exposed radially outwards of the upper heater plate 133. The focus ring 151 surrounds the upper heater plate 133 and the substrate 104 disposed thereon. The focus ring 151 functions to retain the substrate 104 and to modify processing rate around an edge area of the substrate 104 during processing. In one embodiment, the focus ring 151, the upper and lower heater plates 133, 134 may have matching cut outs 155 configured to provide passage for lift fingers 147.

The heated substrate support assembly 132 is mounted on a thermal insulator 143 disposed on the top wall 118 of the first chamber body 111 through a central opening 123a in the bottom wall 123 of the second chamber body 121. In one embodiment, a recess 118a may be formed on the top wall 118 of the first chamber body 111. The recess 118a may allow vacuum ports formed in the first chamber body 111 to connect with the second chamber volume 120. The heated substrate support assembly 132 does not directly contact the chamber body assembly 103. The thermal insulator 143 may be formed from a thermal insulative material, such as a ceramic, to prevent thermal exchange between the heated substrate support assembly 132 and the chamber body assembly 103 including both the second chamber body 121 and the first chamber body 111.

The thermal insulator 143 is positioned to center the heated substrate support assembly 132 relative to other components in the second chamber volume 120, for example the showerhead 129, and the lift hoop assembly 144. In one embodiment, the thermal insulator 143 aligns with a central axis 132a of the heated substrate support assembly 132 to ensure that the heated substrate support assembly 132 remains centered during thermal expansion.

A cantilever tube 136 extends from a backside 134b near the center of the lower heater plate 134. The cantilever tube 136 extends radially outwards to connect with a vertical tube 137 disposed through an opening 153 of the second chamber body 121 and an opening 152 of the first chamber body 111. The cantilever tube 136 and the vertical tube 137 do not contact the second chamber body 121 or the first chamber body 111 to further avoid heat exchange between the heated substrate support assembly 132 and the chamber bodies 111, 121. The cantilever tube 136 and the vertical tube 137 provide a passage for power supplies, sensors and other wiring to be used by the heated substrate support assembly 132. In one embodiment, a heater power source 138, a sensor signal receiver 139 and a chucking control unit 140 are wired to the heated substrate support assembly 132 through the passage in the cantilever tube 136 and the vertical tube 137. In one embodiment, the chucking control unit 140 is configured to provide a vacuum chucking mechanism.

A cooling adapter 141 is coupled to the vertical tube 137 and the first chamber body 111 from outside of the first chamber body 111. The cooling adaptor 141 has cooling channels 141a formed therein. A source for cooling fluid 142 is connected to the cooling channels 141a to provide cooling to the cooling adapter 141 and the vertical tube 137, the cantilever tube 136, and other components of the heated substrate support assembly 132. The cooling adapter 141 generally stays cool during processing, thus, functioning as a thermal insulator between the heated substrate support assembly 132 and the chamber body assembly 103.

In one embodiment, bi-metal connectors may be used for connecting various parts of the heated substrate support assembly 132 to provide uniform temperature control.

A more detailed description of the heated substrate support assembly 132 can be found in U.S. Provisional Patent Application Ser. No. 61/448,018, filed Mar. 1, 2011, entitled "Thin Heater Substrate support".

The dual load lock chamber 100 also includes the lift hoop assembly 144 for transfer substrates between exterior robots and the heated substrate support assembly 132 and for providing a symmetrical processing environment in the second chamber volume 120. The lift hoop assembly 144 include a ring-shaped hoop body 146 disposed within the second chamber volume 120 around the heated substrate support assembly 132. The ring-shaped hoop body 146 is coupled to a lift 160 disposed in an outer region of the second chamber volume 120. The lift 160 moves the ring-shaped hoop body 146 vertically within the second chamber volume 120. In one embodiment, the lift 160 includes a bellows 161 for vertical movements. The lift 160 may be coupled to a motorized actuator 169 disposed outside the chamber body assembly 103.

Three or more lifting fingers 147 are attached to the ring-shaped hoop body 146. The lifting fingers 147 extend vertically downwards and radially inwards from the ring-shaped hoop body 146. The lifting fingers 147 are configured to transfer substrates between the heated substrate support assembly 132 and substrate transfer devices, such as robots, outside the second chamber volume 120. Tips 147a of the lifting fingers 147 form a substrate support surface configured to support the substrate 104 at several points near an edge region of the substrate 104.

Figure 2:
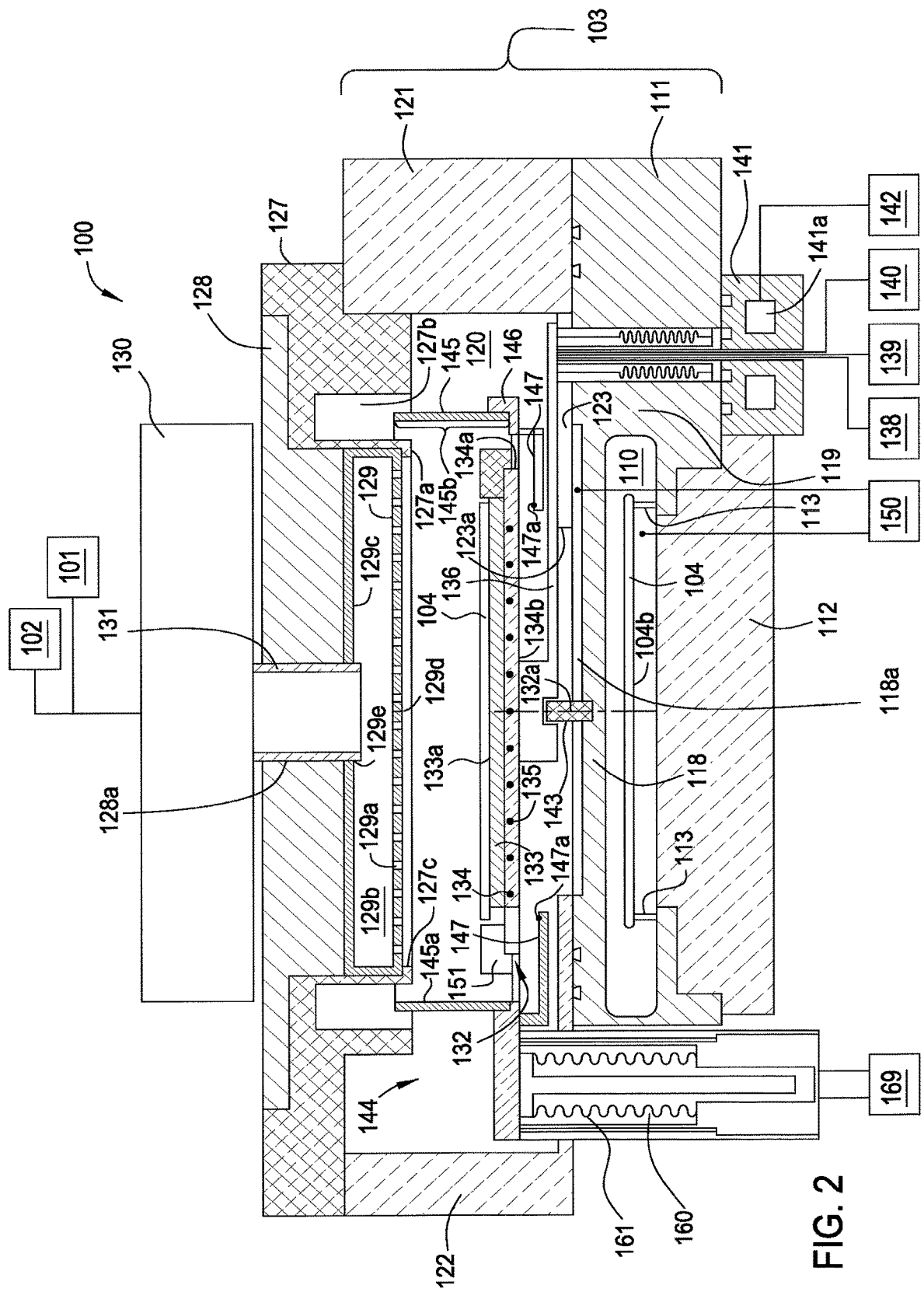
FIG. 2 is a schematic sectional view of the dual load lock chamber of FIG. 1 with a lifting hoop in a loading/unloading position.

FIG. 1 shows the lift hoop assembly 144 in an upper position for substrate exchange with exterior substrate transfer devices. FIG. 2 is a schematic sectional view of the dual load lock chamber 100 the lift hoop assembly 144 in a lower position for substrate processing.

When the ring-shaped hoop body 146 is at a lower position shown in FIG. 2, the lifting fingers 147 are positioned below the upper surface 133a of the upper heater plate 133. As the ring-shaped hoop body 146 rises to the upper position, the lifting fingers 147 move to contact with and lift the substrate 104 from the heated substrate support assembly 132. While the ring-shaped hoop body 146 is at the upper position shown in FIG. 1, external substrate transferring device (not shown) can enter the second chamber volume 120 through one of the ports to remove the substrate 104 from the lifting fingers 147 and subsequently place a new substrate 104 onto the lifting fingers 147. When the ring-shaped hoop body 146 lowers to the lower position again, the new substrate 104 positioned on the lifting fingers 147 is placed on the heated substrate support assembly 132 for processing.

A hoop liner 145 is attached to the ring-shaped hoop body 146. The hoop liner 145 extends vertically upwards from the ring-shaped hoop body 146. In one embodiment, the hoop liner 145 is a ring having a substantially flat cylindrical inner wall 145a. In one embodiment, the height 145b of the cylindrical inner wall 145a of the hoop liner 145 is much greater than the thickness of the heated substrate support assembly 132 and an inner diameter greater than the outer diameters of the heated substrate support assembly 132 and the showerhead 129 so that the hoop liner 145 can create a processing environment around the heated substrate support assembly 132 and the showerhead 129. When the ring-shaped hoop body 146 is in the upper position, shown in FIG. 1, the hoop liner 145 may enter into a cavity 127b formed within the lid liner 127. When the ring-shaped hoop body 146 is in the lower position, the cylindrical inner wall 145a of the hoop liner 145 creates a circular confinement wall within the second chamber volume 120 around the substrate 104 and the region immediately above the heated substrate support assembly 132, therefore, providing a symmetrical processing environment for the substrate 104. In one embodiment, the height 145b of the hoop liner 145 is sufficiently large enough to cover the vertical space between the face plate 129d of the showerhead 129 and the heated substrate support assembly 132. In one embodiment, the hoop liner 145 may be formed from quartz.

A more detailed description of the lift hoop assembly 144 can be found in U.S. Provisional Patent Application Ser. No. 61/448,012, filed Mar. 1, 2011, entitled "Method and Apparatus for Substrate Transfer and Radical Confinement".

The first chamber volume 110 is defined by the first chamber body 111 and a chamber bottom 112 attached to the first chamber body 111. The first chamber body 111 has a top wall 118 and sidewalls 119. The top wall 118, sidewalls 119 and the chamber bottom 112 enclose the first chamber volume 110. A substrate support mechanism configured to support a substrate 104 and exchange substrate with substrate transfer devices, such as substrate transfer robots, may be disposed in the first chamber volume 110. In one embodiment, the substrate support mechanism includes three or more supporting pins 113 for supporting the substrate 104 from its backside 104b. In one embodiment, the supporting pins 113 may be fixedly extended from the first chamber body 111 or the chamber bottom 112. The supporting pins 113 are positioned to interact with substrate transferring devices.

The second chamber volume 120 and the first chamber volume 110 are coupled to a vacuum system 150. In one embodiment, pressures in the second chamber volume 120 and the first chamber volume 110 are controlled independently from one another.

Figure 3:
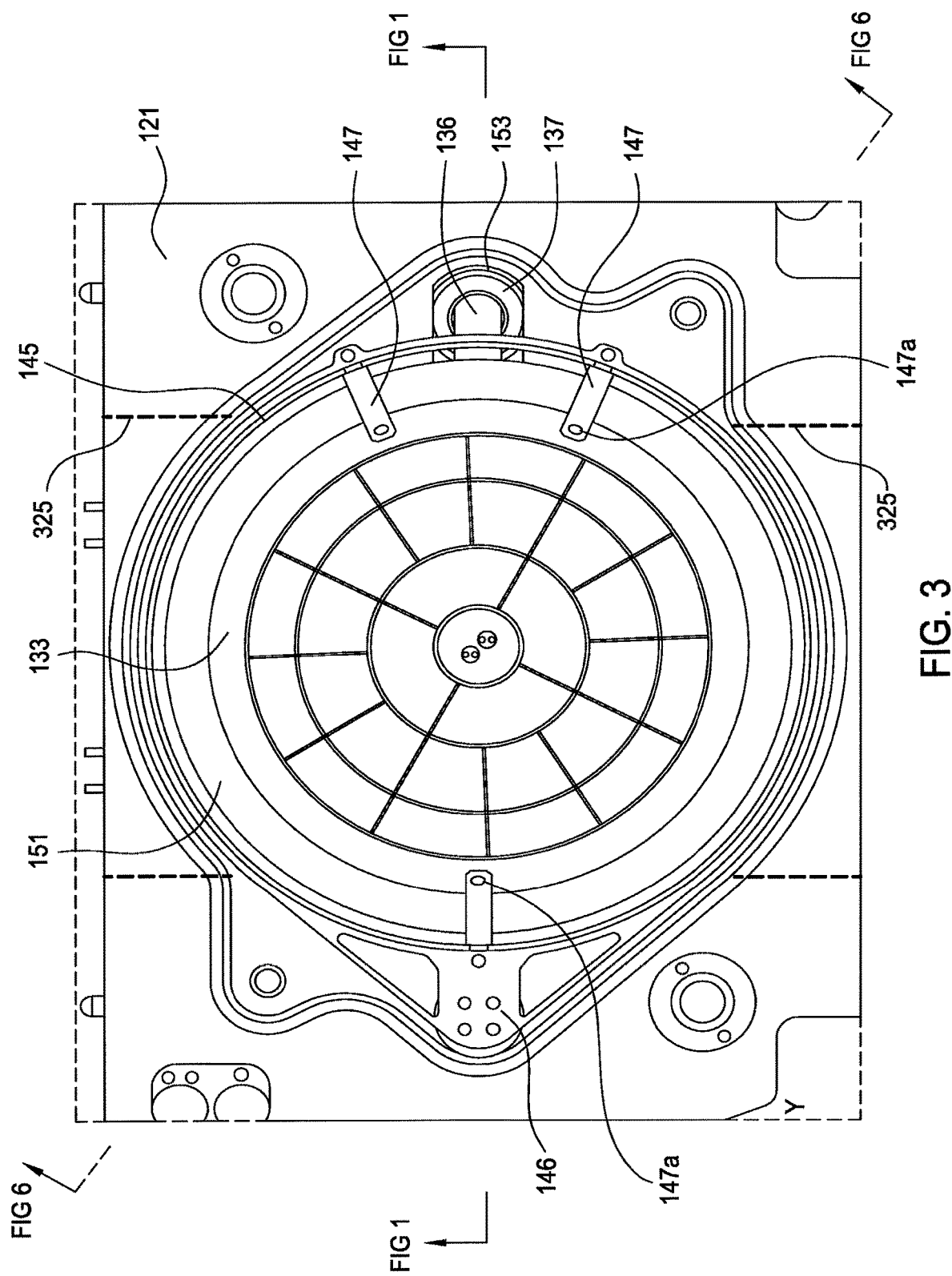
FIG. 3 is a schematic top view of a second chamber volume of the dual load lock chamber according to one embodiment of the present invention.

FIG. 3 is a schematic top view of a second chamber body 121 with the showerhead 129 removed. The second chamber body 121 includes sidewalls 122 and a bottom wall 123. The bottom wall 123 is formed to match the top wall 118 of the first chamber body 111 to form a closed chamber volume, passages for vacuum and utilities (details to follow). Two openings 325 are formed through the sidewalls 122 to allow substrate transferring. A slit valve door may be attached outside of each opening 325 thus providing interface between the second chamber volume 120 and two processing environments.

Figure 4:
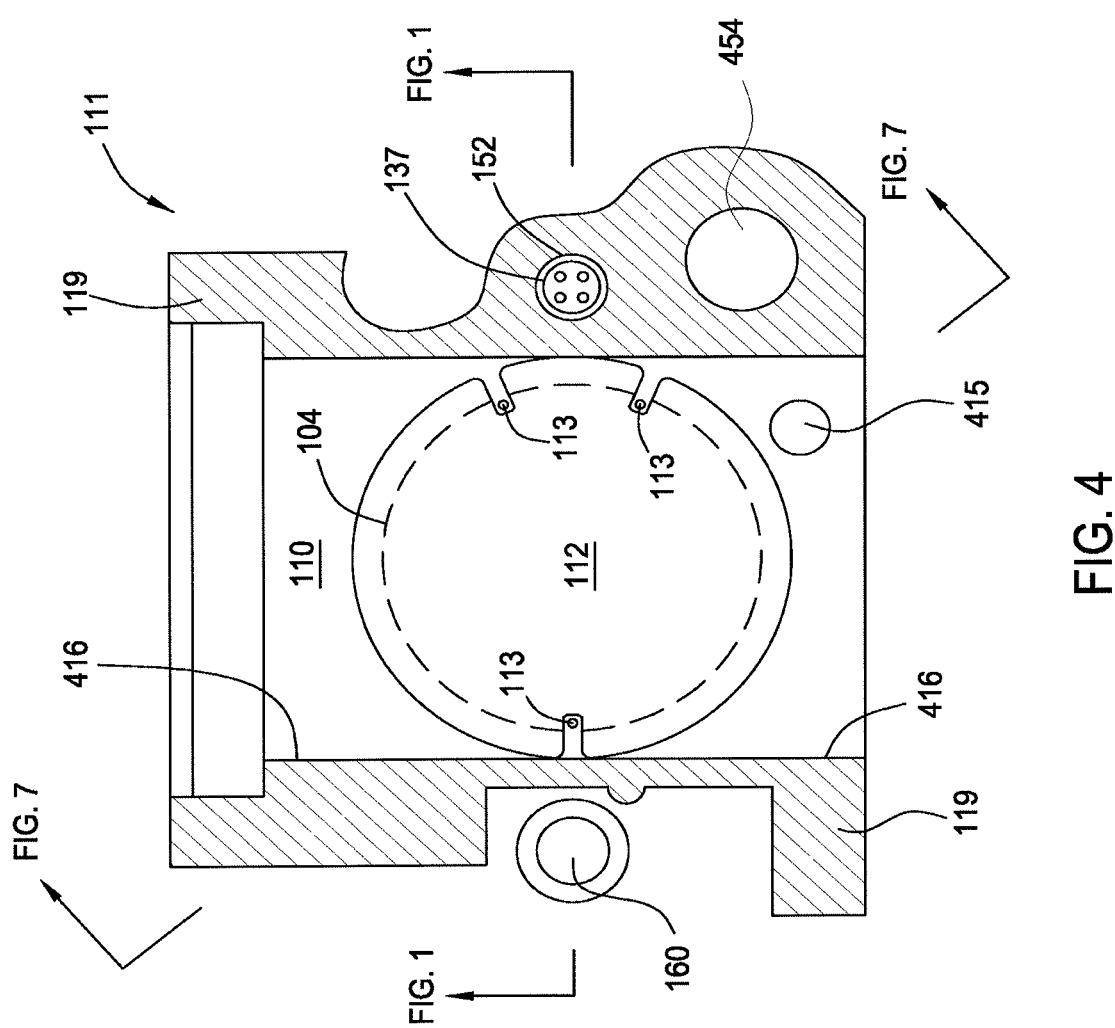
FIG. 4 is a schematic top view of a first chamber volume of the dual load lock chamber according to one embodiment of the present invention.

FIG. 4 is a schematic top view of the first chamber volume 110 of the dual load lock chamber 100. Two openings 416 are formed through the sidewalls 119 of the first chamber body 111 to allow substrate transfer between two processing environments, for example a vacuum transfer chamber and an atmospheric factory interface (both not shown). A slit valve door may be attached outside of each opening 416 to selectively seal the first chamber volume 110 from the two processing environments, such as the vacuum transfer chamber and the atmospheric factor interface. The first chamber body 111 may have a lower vacuum port 415 open to the first chamber volume 110 for pumping the first chamber volume 110.

In one embodiment, an upper vacuum port 454 is also formed through the first chamber body 111 for pumping the second chamber volume 120.

Figure 5:
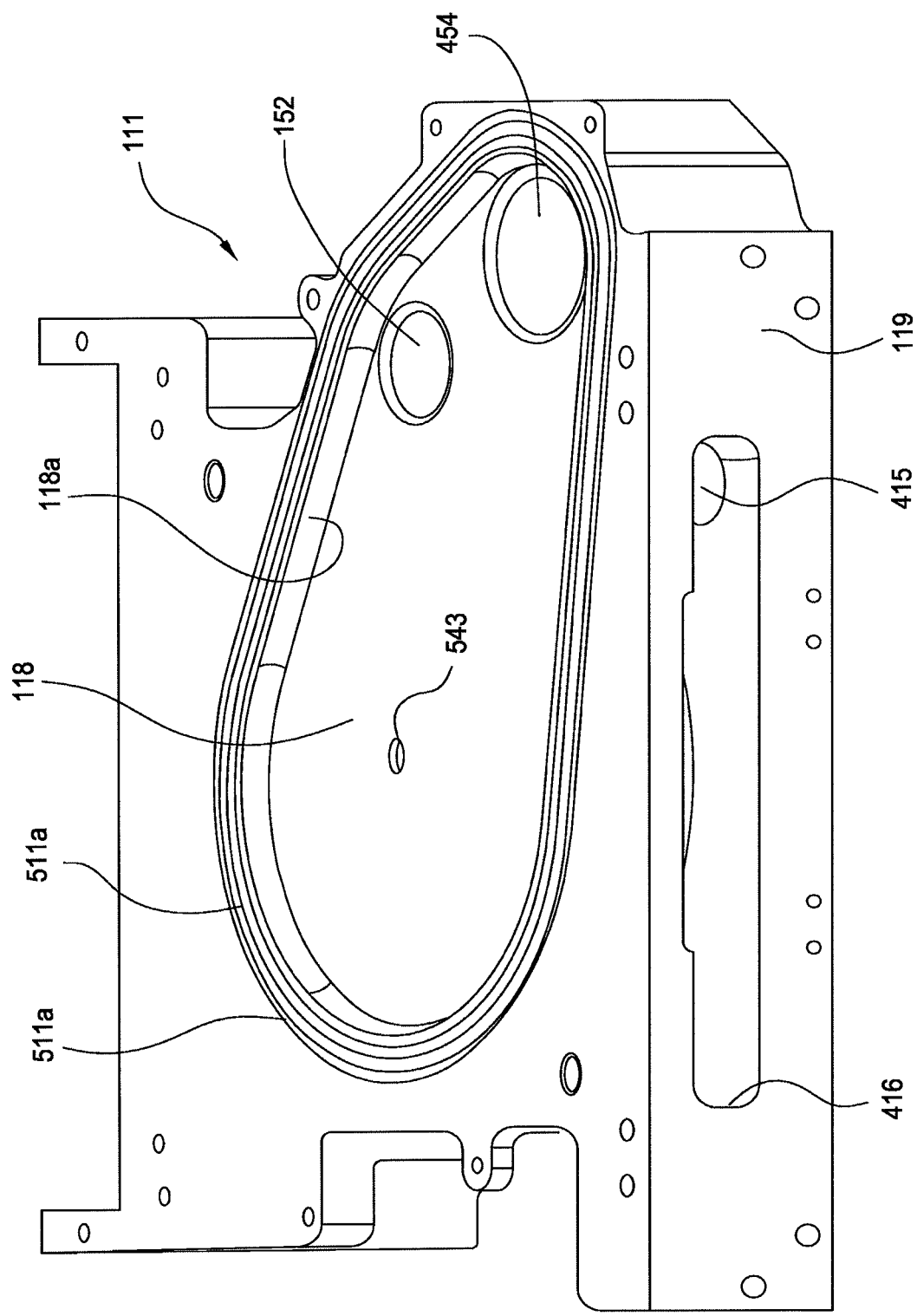
FIG. 5 is a schematic perspective view of a first chamber body of a dual load lock chamber according to one embodiment of the present invention.

FIG. 5 is a schematic perspective view of the first chamber body 111 according to one embodiment of the present invention. The recess 118a is formed on the top wall 118 of the first chamber body 111. The recess 118a allows the heated substrate support assembly 132 to sit low in the second chamber volume 120 thus reducing the second chamber volume 120. A center notch 543 may be formed within the recess 118a for anchoring the thermal insulator 143 (shown in FIG. 1) for supporting the heated substrate support assembly 132. The upper vacuum port 454 is formed through the sidewalls 119 of the first chamber body 111 and opens to the recess 118a formed in the top wall 118 of the first chamber body 111. Thus, the recess 118a also allows pumping channel to the second chamber volume 120 to form within the first chamber body 111. Alternatively, the upper vacuum port 454 may be formed outside the recess 118a to match with a port formed on the bottom wall 123 of the second chamber body 121.

In one embodiment, at least one gland 511a is formed around the recess 118a. A seal may be disposed in each gland 511a to form a vacuum seal between the second chamber body 121 and the first chamber body 111. In one embodiment, two glands 511a may be formed on the top wall 118 of the first chamber body 111 to provide increased vacuum seal.

Figure 6:
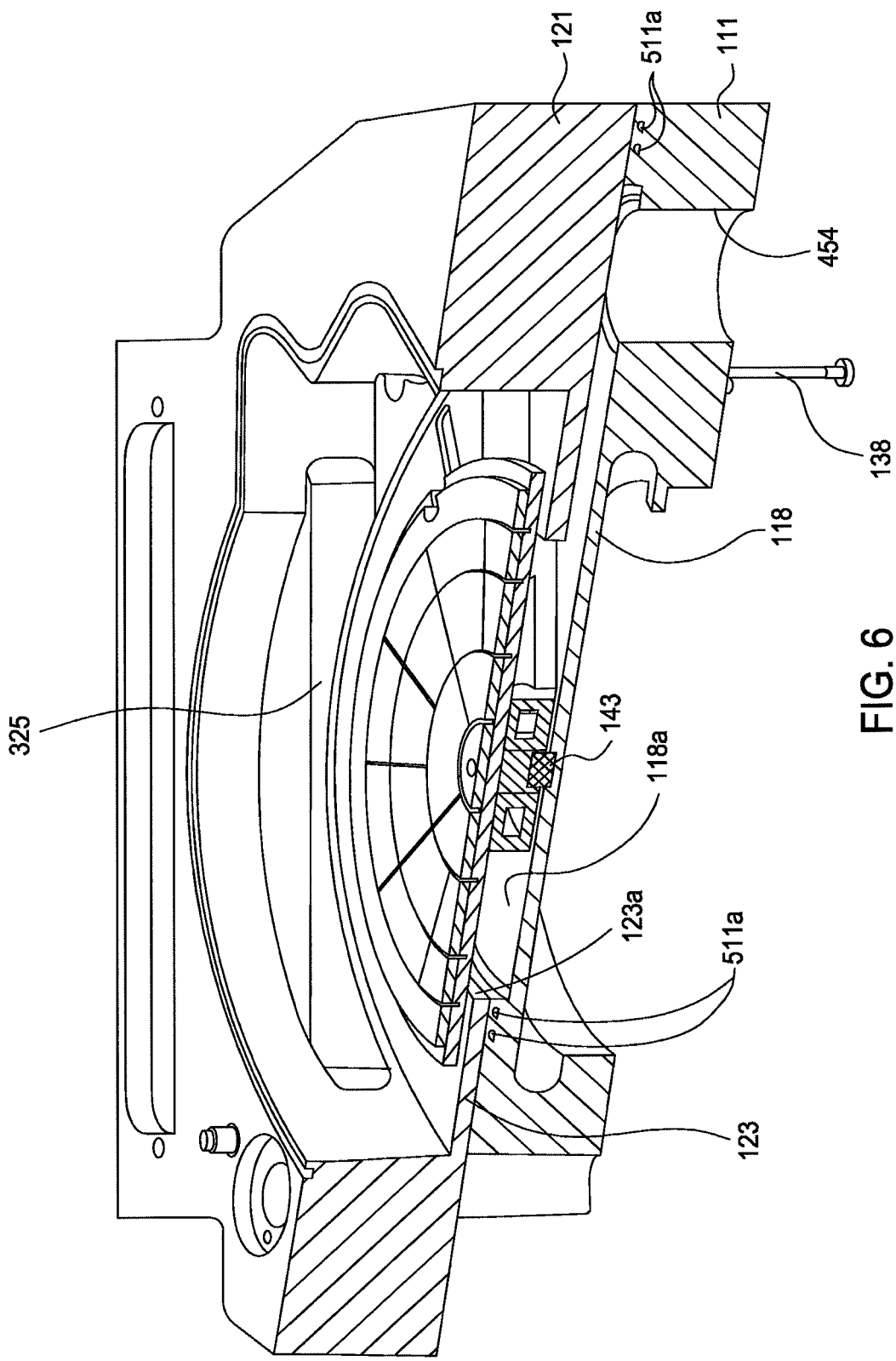
FIG. 6 is a perspective sectional view showing the first chamber body and the second chamber body assembled together.

FIG. 6 is a perspective sectional view showing the second chamber body 121 and the first chamber body 111 in an assembled together. The central opening 123a formed on the bottom wall 123 of the second chamber body 121 connects the interior of the second chamber volume 120 with the recess 118a on the top wall 118 of the first chamber body 111. Thus, the upper vacuum port 454 is in fluid communication with the second chamber volume 120 when the second chamber body 121 is attached to the first chamber body 111.

Figure 7:
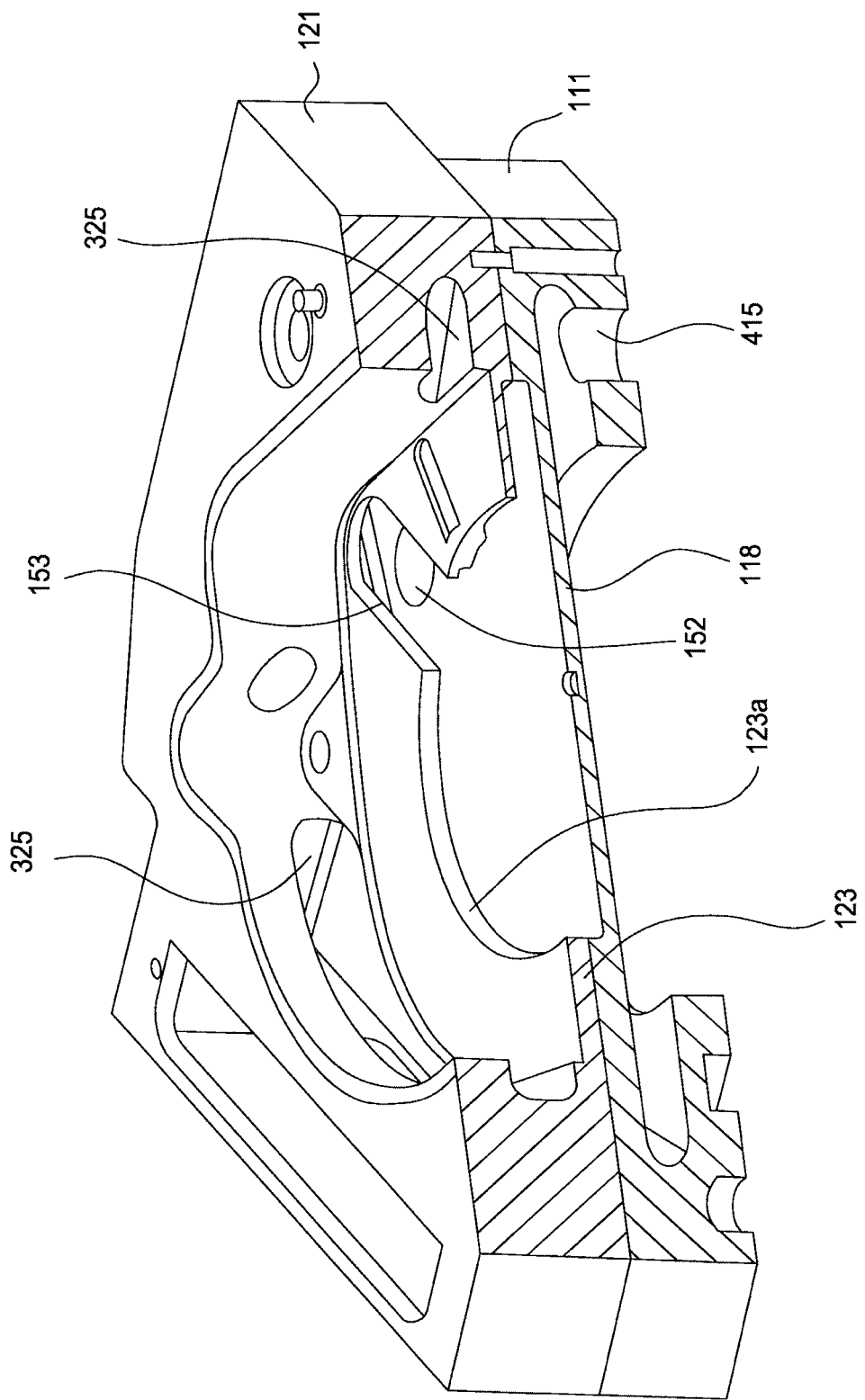
FIG. 7 is a perspective sectional view illustrating pumping channels formed in the second chamber body and the first chamber body with a heater substrate support assembly removed.

FIG. 7 is a perspective sectional view of the second chamber body 121 and the first chamber body 111 with the heated substrate support assembly 132 removed. In FIG. 7, the lower vacuum port 415 is shown. The second chamber body 121 and the first chamber body 111 can be joined together with various methods to obtain a vacuum seal. In one embodiment, the second chamber body 121 is bolted to the first chamber body 111. In another embodiment, the first chamber body 111 and the second chamber body 121 may be brazed together to reduce risk of leak and to eliminate issues with tolerance.

Figure 8:
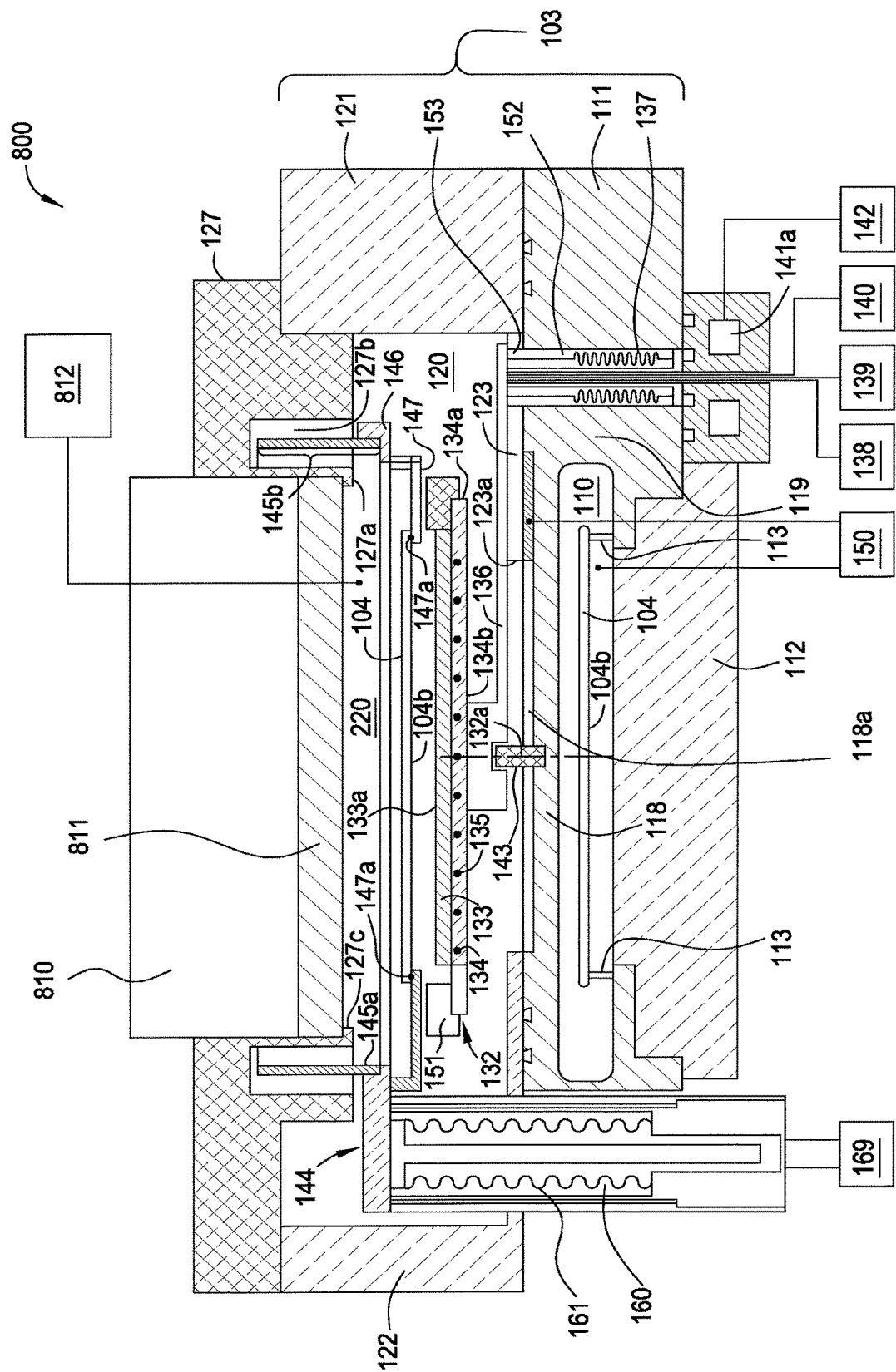
FIG. 8 is a schematic section view a dual load lock chamber according to another embodiment of the present invention.

FIG. 8 is a schematic section view a dual load lock chamber 800 according to another embodiment of the present invention. The dual load lock chamber 800 is similar to the dual load lock chamber 100 except that a lamp assembly 810 in the dual load lock chamber 800 is used in place of the remote plasma source 130 in the dual load lock chamber 100. A quartz window 811 is disposed over the lid liner 127. The lamp assembly 810 is positioned outside the quartz window 811. Radiant energy from the lamp assembly 810 can be directed to the second chamber volume 120 through the quartz window 811. A gas source 812 is in fluid communication with the second chamber volume 120 to provide processing gas and/or inert gas for purging.

Figure 9:
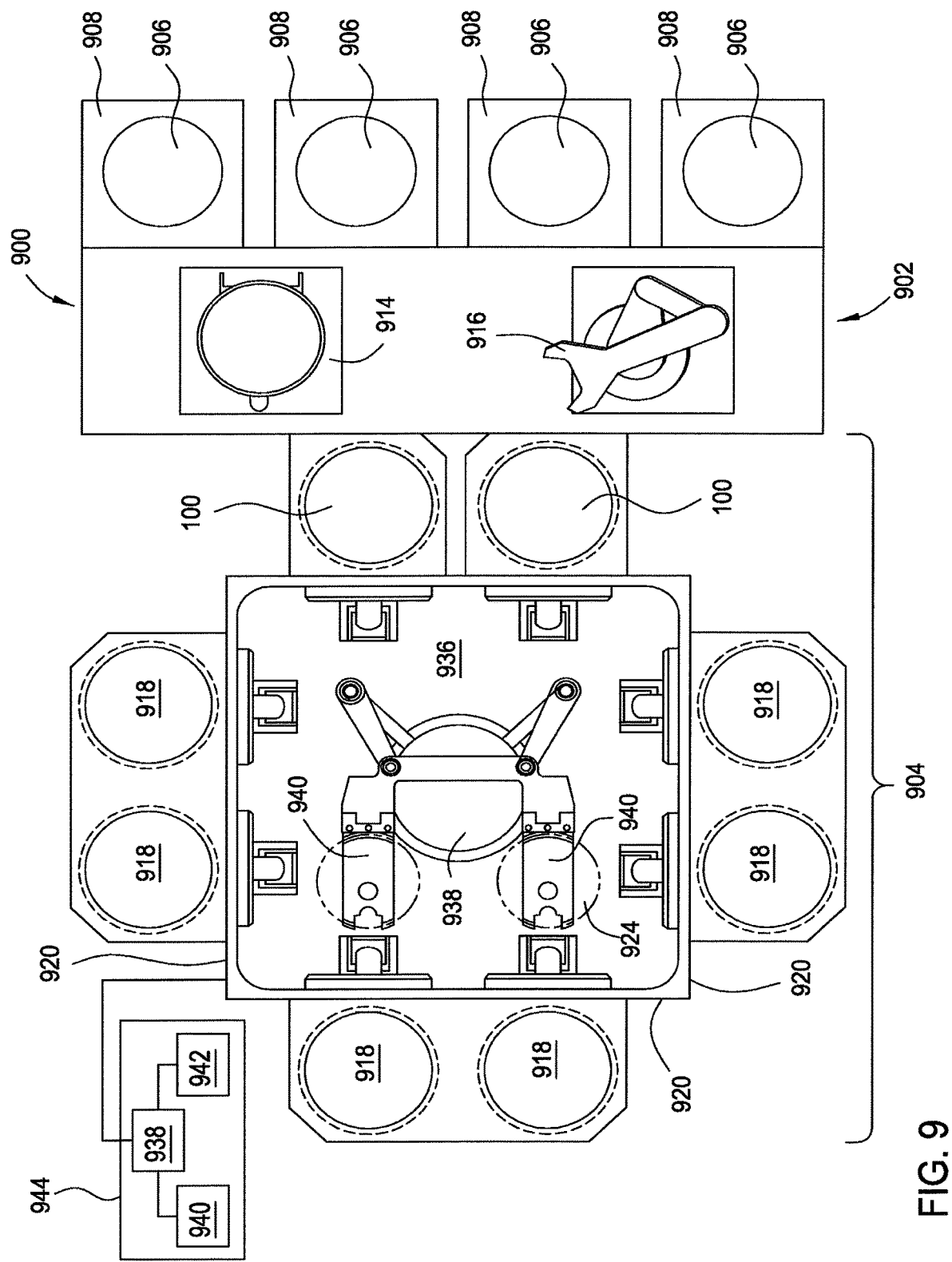
FIG. 9 is a schematic plan view of a substrate processing system including dual load lock chambers according to embodiments of the present invention.

FIG. 9 is a schematic plan view of a substrate processing system 900 that includes one or more dual load lock chambers 100 according to embodiments of the present invention. Dual load lock chamber 800 can also be used in place of dual load lock chambers 100.

The substrate processing system 900 includes a vacuum-tight processing platform 904, a factory interface 902, and a system controller 944. The vacuum-tight processing platform 904 includes a plurality of processing chambers 918 and at least one dual load-lock chamber 100 that are coupled to a vacuum substrate transfer chamber 936. In one embodiment, the vacuum substrate transfer chamber 936 may have four sides 920. Each side 920 is configured to connect with a pair of processing chambers 918 or load lock chambers 100. Six processing chambers 918 are coupled to three sides 920 of the vacuum substrate transfer chamber 936 and two dual load lock chambers 100 are coupled the fourth side 920 of the transfer chamber 936 as shown in FIG. 9. The factory interface 902 is coupled to the vacuum substrate transfer chamber 936 by the dual load lock chambers 100.

In one embodiment, the factory interface 902 comprises at least one docking station 908 and at least one factory interface robot 914 to facilitate transfer of substrates. The docking station 908 is configured to accept one or more front opening unified pod (FOUP). Four FOUPS 906 are shown in the embodiment of FIG. 9. The factory interface robot 914 having a blade 916 disposed on one end of the factory interface robot 914 is configured to transfer the substrate from the factory interface 902 to the vacuum-tight processing platform 904 for processing through the dual load lock chambers 100.

Each of the dual load lock chambers 100 have two ports coupled to the factory interface 902 and two ports coupled to the vacuum substrate transfer chamber 936. The dual load lock chambers 100 are coupled to a pressure control system (not shown) which pumps down and vents the dual load lock chambers 100 to facilitate passing the substrate between the vacuum environment of the vacuum substrate transfer chamber 936 and the substantially ambient (e.g., atmospheric) environment of the factory interface 902.

The transfer chamber 936 has a vacuum robot 937 disposed therein for transferring a substrate 924 among the dual load lock chambers 100 and the processing chambers 918. In one embodiment, the vacuum robot 937 has two blades 940 each capable of transferring a substrate 924 among the dual load lock chambers 100 and the processing chambers 918. In one embodiment, the vacuum robot 937 is configured to simultaneously transfer two substrates 924 to two processing chambers 918 or two load locks 100.

In one embodiment, at least one processing chambers 918 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the processing chambers 918 may be one of a HART™, E-MAX®, DPS®, DPS II, PRODUCER E, or ENABLER® etch chamber also available from Applied Materials, Inc. Other etch chambers, including those from other manufacturers, may be utilized. The etch chambers may use a halogen-containing gas to etch the substrate 924 therein. Examples of halogen-containing gas include hydrogen bromide (HBr), chlorine ($Cl_2$), carbon tetrafluoride ($CF_4$), and the like. After etching the substrate 924, halogen-containing residues may be left on the substrate surface.

The halogen-containing residues may be removed by a thermal treatment process in the dual load lock chambers 100. For example, a thermal treatment process may be performed in the second chamber volume 120 of one or both dual load lock chambers 100. Alternatively, an ashing process may be performed in the second chamber volume 120 of one or both dual load lock chambers 100.

The system controller 944 is coupled to the substrate processing system 900. The system controller 944 controls the operation of the substrate processing system 900 using a direct control of the processing chambers 918 of the substrate processing system 900 or alternatively, by controlling the computers (or controllers) associated with the processing chambers 918 and the substrate processing system 900. In operation, the system controller 944 enables data collection and feedback from the respective chambers and system controller 944 to optimize performance of the substrate processing system 900.

The system controller 944 generally includes a central processing unit (CPU) 938, a memory 939, and support circuit 942. The CPU 938 may be one of any form of a general purpose computer processor that can be used in an industrial setting. The support circuits 942 are conventionally coupled to the CPU 938 and may comprise cache, clock circuits, input/output subsystems, power supplies, and the like. The software routines, such as a method 1000 for removing halogen-containing residues described below with reference to FIG. 10 and/or a method 1100 for ashing described with reference to FIG. 11, when executed by the CPU 938, transform the CPU 938 into a specific purpose computer (system controller) 944. The software routines may also be stored and/or executed by a second controller (not shown) that is located remotely from the substrate processing system 900.

Figure 10:
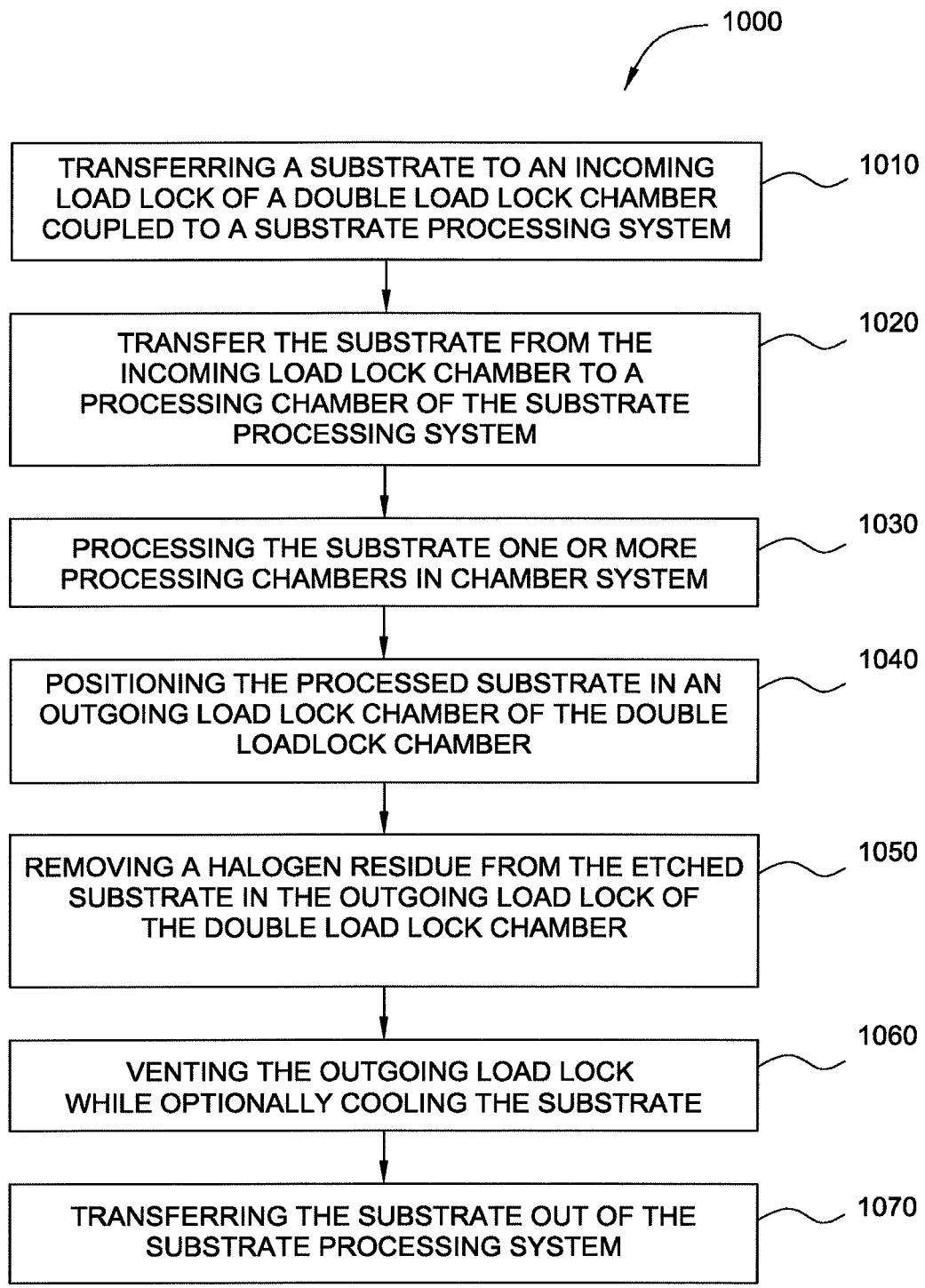
FIG. 10 is a flow diagram illustrating a method for processing a substrate according to one embodiment of the present invention.

FIG. 10 is a flow chart illustrating a method 1000 for processing a substrate according to one embodiment of the present invention. Particularly, the method 1000 is configured to remove halogen-containing residue from a substrate. The method 1000 may be performed in the substrate processing system 900 as described in FIG. 9. It is contemplated that the method 1000 may be performed in other suitable processing systems, including those from other manufacturers.

The method 1000 begins at box 1010 by transferring a substrate having a layer disposed thereon from one of the FOUPs 906 to the dual load lock chamber 100 and pumping down the chamber volume containing the substrate to a vacuum level equal to that of the vacuum substrate transfer chamber 936. In one embodiment, the substrate transferred to the dual load lock chamber 100 may be transferred from the factory interface 902 only into the first chamber volume 110 of the dual load lock chamber 100. In this manner, cross contamination between processed and unprocessed substrate is beneficially reduced.

In another embodiment, the substrate transferred to the dual load lock chamber 100 may be preheated to a predetermined temperature by the heated substrate support assembly 132 in the second chamber volume 120 of the load lock chamber 100. In one embodiment, the substrate may be preheated to a temperature between about 20 degrees Celsius and about 400 degrees Celsius.

At box 1020, after the pressure within the dual load lock chamber 100 and the vacuum substrate transfer chamber 936 are substantially equal, the vacuum robot 937 transfers the substrate from the dual load lock chamber 100 to one of the processing chambers 918.

At box 1030, the substrate is etched in one of the processing chamber 918 to form desired features and patterns on the substrate.

In one embodiment, the substrate is etched in one of the processing chambers 918 by supplying a gas mixture having at least a halogen-containing gas. The patterned mask may include photoresist and/or hardmask. Suitable examples of halogen-containing gas include, but not limited to, hydrogen bromide (HBr), chlorine ($Cl_2$), carbon tetrafluoride ($CF_4$), and the like. In an exemplary embodiment suitable for etching polysilicon, the gas mixture supplied to the processing chamber 918 provides a gas mixture including hydrogen bromide (HBr) and chlorine ($Cl_2$) gas at a flow rate between about 20 sccm and about 300 sccm, such as between 20 sccm and about 60 sccm, for example about 40 sccm. The hydrogen bromide (HBr) and chlorine ($Cl_2$) gas may have a gas ratio ranging between about 1:0 and about 1:30, such as about 1:15. An inert gas may be supplied with the gas mixture to the processing chamber 918. Suitable examples of inert gas may include nitrogen ($N_2$), argon (Ar), helium (He) and the like. In one embodiment, the inert gas, such as $N_2$, may supplied with the gas mixture at a flow rate between about 0 sccm and about 200 sccm, such as between about 0 sccm and about 40 sccm, for example about 20 sccm. A reducing gas, such as carbon monoxide (CO) may be supplied with the gas mixture. The plasma power for the etch process may be maintained between about 200 Watts and about 3000 Watts, such as about 500 Watts and about 1500 Watts, for example about 1100 Watts, and the bias power may be maintained between about 0 Watts and about 300 Watts, such as about 0 Watts and about 80 Watts, for example about 20 Watts. The process pressure may be controlled at between about 2 mTorr and about 100 mTorr, such as between about 2 mTorr and about 20 mTorr, for example about 4 mTorr, and the substrate temperature may be maintained at between about 0 degrees Celsius and about 200 degrees Celsius, such as between about 0 degrees Celsius and about 100 degrees Celsius, for example about 45 degrees Celsius.

During etching process, the etched materials may combine with the components of the etchant chemistry, as well as with the components of the mask layers, if any, and by-products of the etch process, thereby forming halogen-containing residues. In one embodiment, the materials on the substrate to be etched may include photoresist layer, hard mask layer, bottom anti-reflective coating (BARC), polysilicon, crystalline silicon, gate oxide, metal gate, such as Titanium nitride (TiN), and high-k materials, such as aluminum oxide ($Al_2O_3$), hafnium containing oxide. Suitable examples of hard mask layer include silicon nitride, TEOS, silicon oxide, amorphous carbon, and silicon carbide. The halogen-containing residues deposit on the surfaces of the substrate. The halogen-containing residue may release (e.g., outgas) gaseous reactants, such as bromine ($Br_2$), chlorine ($Cl_2$), hydrogen chloride (HCl), hydrogen bromine (HBr) and the like, if exposed to atmospheric pressures and/or water vapor. The release of such reactants may cause corrosions and particle contamination of the processing apparatus and factory interfaces during substrate transfer, such as the vacuum-tight processing platform 904 and the factory interface 902 as described in FIG. 9. In embodiments where metallic layers, such as Cu, Al, W, are exposed to the substrate surface, the metallic layer may be corroded by the released gaseous reactants if they are not removed by the inventive process described below, thereby adversely deteriorating the performance of devices formed on the substrate.

Halogens may also be present on the surface of substrates that are processed in a vacuum environment in a manner other than etching. Therefore, it is contemplated that halogens may be removed from those substrates using the method and apparatus described herein.

At box 1040, the processed (e.g., etched) substrate is transferred to the second chamber volume 120 of the dual load lock chamber 100 to remove the halogen-containing residues from the substrate generated during processing of box 1030 prior to exposure to atmospheric conditions or water vapor in the factory interface or other location. After etch processing, the vacuum robot 937 in the vacuum substrate transfer chamber 936 transfers the etched substrate from one of the processing chambers 918 to the lifting fingers 147 in the second chamber volume 120 of the load lock chamber 100. The lifting fingers 147 lower and transfer the etched substrate to the heated substrate support assembly 132.

At box 1050, a thermal treatment process is performed on the etched substrate to remove the halogen-containing residues on the etched substrate surface. The heater 135 in the heated substrate support assembly 132 is used to cause the temperature of the surface of the substrate to rise, thereby causing halogen-based reactants disposed on the etched substrate surface to be released and/or outgassed. The heated substrate support assembly 132 heats the substrate to a temperature between about 20 degrees Celsius and about 1000 degrees Celsius, such as between about 150 degrees Celsius and about 300 degrees Celsius, for example about 250 degrees Celsius, at between about 5 seconds and about 30 seconds. The rapid heating of the substrate by the heated substrate support assembly 132 allows the halogen-containing residues on the etched substrate to be removed without increasing process cycle time which would be encountered if the residues were removed in one if the processing chambers. In one embodiment, the substrate may be heated by the heated substrate support assembly 132 at a predetermined time period until the halogen-containing residues on the etched substrate are removed therefrom. The time or endpoint may be determined using the sensors connected to the sensor signal receiver 139. The etched substrate may be heated at a temperature between about 150 degrees Celsius and about 300 degrees Celsius, such as 250 degrees Celsius for between about 10 seconds to about 120 seconds, such as between about 30 seconds to about 90 seconds.

In one embodiment, the gas mixture may be provided to the second chamber volume 120 of the dual load lock chamber 100 through the remote plasma source 130. The remote plasma source 130 ionizes the gas mixture. The dissociated ions and species promote the conversion of the outgassed halogen-based reactants into non-corrosive volatile compounds, thereby increasing the removal efficiency of the halogen-containing residues from the etched substrate surface. The gas mixture may include an oxygen-containing gas, such as $O_2$, $O_3$, water vapor ($H_2O$), a hydrogen-containing gas, such as $H_2$, forming gas, water vapor ($H_2O$), alkanes, alkenes, and the like, or an inert gas, such as a nitrogen gas ($N_2$), argon (Ar), helium (He), and the like. For example, the gas mixture may include oxygen, nitrogen, and a hydrogen-containing gas. In one embodiment, the hydrogen-containing gas is at least one of hydrogen ($H_2$) and water vapor ($H_2O$). In embodiments which mask layers is present on the substrate, the mask layers may be simultaneously removed with the halogen-containing residues, e.g., the mask is stripped of the photoresist in the load lock chamber.

In one embodiment, the remote plasma source may provide a plasma power at between about 500 Watts and 6000 Watts. In embodiments where the plasma is present, an inert gas, such as Ar, He or $N_2$, may be supplied with the gas mixture.

Alternatively, when dual load lock chamber 800 is used in place of the dual load lock chamber 100, a gas mixture may be supplied from the gas source 812 to the second chamber volume 120 while heating the etched substrate. The etched substrate is exposed to and reacts with the gas mixture. The gas mixture converts the outgassed halogen-based reactants into non-corrosive volatile compounds that are pumped out of the dual load lock chamber 100.

Optionally, the substrate may be returned to one of the processing chamber 918 of the system for additional processing prior to removing from the vacuum environment. The substrate, after the halogen removal process at box 1050, will not introduce halogens into the processing chambers during subsequent processing, thereby preventing damage to the processing chambers.

At box 1060, the second chamber volume 120 is vented to atmospheric pressure. Optionally, the heated substrate support assembly 132 may be cooled to lower the substrate temperature to a desired level through the cooling adapter 141 during venting. In one embodiment, the etched substrate may be cooled to a temperature ranging between about 10 degrees Celsius and about 125 degrees Celsius that allows the etched substrate returning to the FOUPs 906 without causing damage to the FOUPs 906.

At box 1070, the etched substrate from the second chamber volume 120 of the load lock chamber 100 and return to one of the FOUPs 906 once the pressures of the second chamber volume 120 and the factory interface 902 are matched.

Figure 11:
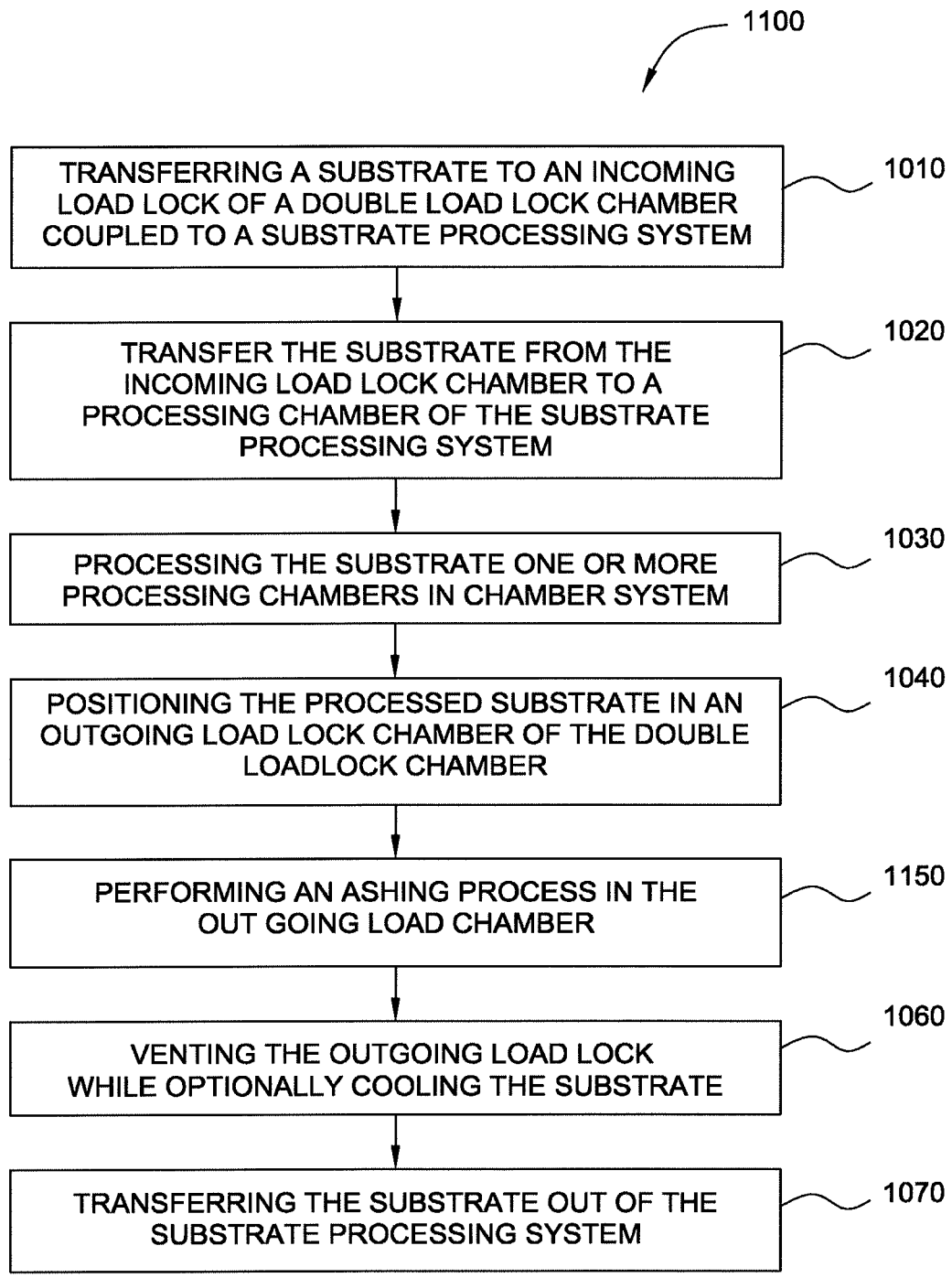
FIG. 11 is a flow diagram illustrating a method for processing a substrate according to another embodiment of the present invention.

In another embodiment of the present invention, a photoresist removal process may be performed in the dual load lock chamber according to embodiments of the present invention. FIG. 11 is a flow diagram illustrating a method 1100 including removing photoresist from a substrate in a load lock chamber as the substrate exits a substrate processing system, such as the substrate processing system 900 of FIG. 9.

The method 1100 is similar to the method 1000 of FIG. 10 except the method 1100 includes an ashing process described in box 1150.

At box 1150, an ashing process is performed in the second chamber volume 120 of the dual load lock chamber 100 to remove photoresist from the substrates. An oxygen-based plasma may be used. For example, an oxidizing gas such as $O_2$, is flown to the remote plasma source 130 at a flow rate of 100 to 10,000 sccm. The oxidizing gas is formed into a plasma when 600 to 6000 watts of RF energy is applied to the remote plasma source 130. The gas pressure in the second chamber volume 120 may be maintained at 0.3 to 3 Torr. The temperature of the substrate may be maintained at 15 to 300 degrees Celsius. Various oxidizing gases can be used including, but not limited to, $O_2$ $O_3$, $N_2O$, $H_2O$, CO, $CO_2$, alcohols, and various combinations of these gases. In other embodiments of the invention, nonoxidizing gases may be used including, but not limited to, $N_2$, $H_2O$, $H_2$, forming gas, $NH_3$, $CH_4$, $C_2H_6$, various halogenated gases ($CF_4$, $NF_3$, $C_2F_6$, $C_4F_8$, $CH_3F$, $CH_2F_2$, $CHF_3$), combinations of these gases and the like.

The method 1000 or 1100 may incorporate the dual load lock chamber 100 by using the first chamber volume 110 exclusively for incoming substrates and using the second chamber volume 120 exclusively for outgoing substrates. By keeping the incoming and outgoing substrates in separate paths, embodiments of the present invention effectively prevent cross-contamination between processed and unprocessed substrates.

While the foregoing is directed to embodiments of the present invention, other and further embodiments of the invention may be devised without departing from the basic scope thereof, and the scope thereof is determined by the claims that follow.

What is claimed is:

1. A substrate processing system, comprising:
   a vacuum tight processing platform including a vacuum robot operable to move substrates;
   a factory interface having one or more docking stations operable to receive substrate carriers thereat; and
   a load lock chamber positioned between the vacuum tight processing platform and the factory interface, the load lock chamber, comprising:
      a first chamber body defining a first chamber volume located between and coupled with the vacuum tight processing platform and the factory interface, wherein the first chamber volume is selectively connectable to the factory interface and the vacuum tight processing platform through two openings, the first chamber body having a recess in a top surface of a top wall, and
      a second chamber body defining a second chamber volume operable to carry out a process on a substrate, the second chamber volume coupled to the vacuum tight processing platform and located at a different level than the first chamber volume, wherein:
      the second chamber body has a central opening in a bottom wall which connects with the recess in the top wall of the first chamber body, the recess fluidly connecting the second chamber volume with a vacuum port in the first chamber body,
      the second chamber body further comprises a lift hoop assembly including a ring-shaped hoop body, and horizontally extending lift fingers operable to support a substrate underneath the ring-shaped hoop body, and
      the ring-shaped hoop body and the horizontally extending lift fingers are operable to move as a unit upon actuation by a motorized actuator.

2. The substrate processing system of claim 1, wherein the second chamber body is positioned above the first chamber body.

3. The substrate processing system of claim 1, wherein the second chamber volume is defined by sidewalls of the second chamber body, a lid liner disposed over the sidewalls, the bottom wall of the second chamber body and the top wall of the first chamber body.

4. The substrate processing system of claim 1, wherein the first chamber body has a first opening of the two openings adapted to couple to, and allow access from, a transfer chamber of the vacuum tight processing platform.

5. The substrate processing system of claim 1, further comprising a remote plasma source connected to the second chamber volume and operable to supply a plasma to the second chamber volume.

6. The substrate processing system of claim 1, wherein the second chamber body further comprises a heated substrate support assembly.

7. The substrate processing system of claim 1, further comprising:
   a second load lock chamber arranged in a side-by-side orientation with the load lock chamber, wherein the second chamber body of the load lock chamber is positioned above the first chamber body of the load lock chamber and wherein the second load lock chamber comprises a second chamber body positioned above a first chamber body.

8. The substrate processing system of claim 7, further comprising a first remote plasma source connected with the load lock chamber and a second remote plasma source connected with the second load lock chamber.

9. The substrate processing system of claim 1, wherein the lift hoop assembly further comprises a hoop liner that is supported by and extends vertically upward from the ring-shaped hoop body.

10. The load lock chamber of claim 9, wherein the lift hoop assembly comprises the hoop liner disposed in an annular shaped pocket formed radially outward from a showerhead, and wherein the hoop liner is movable.

11. A load lock chamber, comprising:
    a first chamber body defining a first chamber volume adapted to be located between, coupled with, and accessed from a vacuum tight processing platform and a factory interface, wherein the first chamber volume has a first opening and a second opening each having a slit valve, the first chamber body having a recess in a top surface of a top wall of the first chamber body, and
    a second chamber body defining a second chamber volume operable to carry out a process on a substrate, the second chamber volume adapted to be coupled with, and accessed from the vacuum tight processing platform and located at a different level than the first chamber volume, wherein:
    the second chamber body has a central opening in a bottom wall which connects with the recess in the top wall of the first chamber body, the recess fluidly connecting the second chamber volume with a vacuum port in the first chamber body,
    the second chamber body further comprises a lift hoop assembly including a ring-shaped hoop body, and horizontally extending lift fingers operable to support a substrate underneath the ring-shaped hoop body, and
    the ring-shaped hoop body and the horizontally extending lift fingers are operable to move as a unit upon actuation by a motorized actuator.

12. The load lock chamber of claim 11, wherein the second chamber body is positioned above the first chamber body.

13. The load lock chamber of claim 11, wherein the second chamber volume is defined by sidewalls of the second chamber body, a lid liner disposed over the sidewalls, a bottom wall of the second chamber body and the top wall of the first chamber body.

14. The load lock chamber of claim 11, further comprising a heated substrate support assembly.

15. The load lock chamber of claim 11, wherein the lift hoop assembly further comprises a hoop liner that is supported by and extends vertically upward from the ring-shaped hoop body.

16. The load lock chamber of claim 11, wherein the lift hoop assembly comprises the hoop liner disposed in an annular shaped pocket formed radially outward from a showerhead, and wherein the hoop liner is movable.

17. The load lock chamber of claim 16, wherein the movable hoop liner is formed from quartz.

18. A method of processing substrates using the load lock chamber of claim 11, comprising:

providing the vacuum tight processing platform including a robot;

providing the factory interface adjacent to the vacuum tight processing platform operable to receive substrates from load ports;

providing the load lock chamber located between the vacuum tight processing platform and the factory interface, the load lock chamber comprising the first chamber body coupled between the vacuum tight processing platform and the factory interface at a first level, and the second chamber body at a second different level; and carrying out a process on the substrate in the second chamber body.

19. The method of claim 18, wherein the process on the substrate comprises an oxide removal.

20. The method of claim 18, wherein the process on the substrate comprises an ashing process.

* * * * *